United States Patent [19]

Moh et al.

[11] Patent Number: 5,213,878

[45] Date of Patent: May 25, 1993

[54] CERAMIC COMPOSITE FOR ELECTRONIC APPLICATIONS

[75] Inventors: Kyung H. Moh, Woodbury; Charles D. Hoyle, Stillwater; Charles E. Boyer, III, Oakdlae, all of Minn.

[73] Assignee: Minnesota Mining and Manufacturing Company, St. Paul, Minn.

[21] Appl. No.: 828,248

[22] Filed: Jan. 30, 1992

Related U.S. Application Data

[62] Division of Ser. No. 498,350, Mar. 23, 1990, Pat. No. 5,108,958.

[51] Int. Cl.$^5$ .............................................. B32B 9/00
[52] U.S. Cl. ...................................... 428/209; 428/402; 428/457; 428/901; 428/206; 428/313.3
[58] Field of Search ................... 428/206, 209, 313.3, 428/457, 901, 402

[56] References Cited

U.S. PATENT DOCUMENTS

| | | | |
|---|---|---|---|
| 3,795,524 | 3/1974 | Sowman | 106/65 |
| 4,349,456 | 9/1982 | Sowman | 252/317 |
| 4,358,772 | 11/1982 | Leggett | 343/872 |
| 4,642,299 | 2/1987 | Hsieh | 501/97 |
| 4,654,314 | 3/1987 | Takagi et al. | 501/9 |
| 4,711,860 | 12/1987 | Gadkaree et al. | 501/9 |
| 4,714,687 | 12/1987 | Holleran et al. | 501/9 |
| 4,752,531 | 6/1988 | Steinberg | 428/426 |
| 4,777,153 | 10/1988 | Sonupariak et al. | 264/44 |
| 4,780,435 | 10/1988 | Chu et al. | 501/136 |
| 4,781,968 | 11/1988 | Kellerman | 428/209 |
| 4,867,935 | 9/1989 | Morrison, Jr. | 264/61 |
| 4,988,645 | 1/1991 | Holt et al. | 501/91 |

FOREIGN PATENT DOCUMENTS

| | | |
|---|---|---|
| 0228889 | 12/1986 | European Pat. Off. . |
| 0234896 | 2/1987 | European Pat. Off. . |
| 53-064495 | 6/1978 | Japan . |
| 57-89212 | 6/1982 | Japan . |
| 57-089212 | 6/1982 | Japan . |
| 59-111345 | 6/1984 | Japan . |
| 62-206861 | 9/1987 | Japan . |

OTHER PUBLICATIONS

L. M. Levinson, "Electronic Ceramics", Marcel Dekker, Inc. (New York:1988), pp. 1-44.

R. R. Tummala, "Ceramics in Microelectronic Packaging", Am. Ceram. Soc. Bull., 67, [4], (1988), pp. 752-758.

Y. Shimada et al., "Low Firing Temperature Multilayer Glass-Ceramic Substrate, IEEE Transactions on Components, Hybrids, and Manufacturing Technology", CHMT-6, [4], (1983), pp. 382-388.

Y. Iwata et al., "Development of Ceramic Composite (Porous Ceramic and Resin Composite with Copper Foil)", IMC 1986 Proceedings, Kobe, (May 28-30, 1986).

European Search Report.

H. Verweij et al., "Hollow Glass Microsphere Composites: Preparation and Properties", Journal of Materials Science, 20, (1985), pp. 1069-1078.

*Primary Examiner*—Patrick J. Ryan
*Assistant Examiner*—Cathy K. Lee
*Attorney, Agent, or Firm*—Gary L. Griswold; Walter N. Kirn; David L. Weinstein

[57] ABSTRACT

Machinable ceramic composites having a low dielectric constant. The composite comprises ceramic bubbles uniformly distributed throughout a ceramic matrix. These composites can be used as ceramic substrates and housings in electronic packaging, and as windows transparent to microwave and millimeter wave radiation.

6 Claims, No Drawings

CERAMIC COMPOSITE FOR ELECTRONIC APPLICATIONS

This is a division of application No. 07/498,350 filed Mar. 23, 1990, now U.S. Pat. No. 5,108,9

BACKGROUND OF THE INVENTION

Field of the Invention

This invention relates to electronic packaging, and more particularly, to ceramic composites for electronic packaging.

Discussion of the Art

Electronic packaging most often refers to an assembly wherein semiconducting silicon chips are attached to a substrate by a conductive pathway and encapsulated by plastic or ceramic materials. Encapsulation with an opaque material is necessary in order to protect the semiconducting silicon chips from light, and hence, the photoelectric effect, which generates stray current. Additionally, the packaging can perform a structural function by protecting delicate wire-bonded leads from damage. Package forms include dual-in-line packages (DIP), chip carriers, flat-packs, and pin grid arrays.

Materials having a low dielectric constant (e.g., less than 4.0) are preferred for substrates for electronic packaging in order to reduce dielectric loss at high frequencies. A loss in signal resolution (wave form shape) can occur in signal transmission when an integrated circuit (IC) chip is coupled to a material having a high dielectric constant. In existing electronic packaging media, materials having a low dielectric constant comprise polymeric materials where both the inherent characteristics of the polymer and a low level of impurities combine to make a material having a low dielectric constant. However, polymers have high thermal expansion coefficients (typically $15 \times 10^{-6}$). Because these coefficients do not match those of silicon ($4.0 \times 10^{-6}$), these materials suffer from breakage due to thermally-induced mechanical stresses between the substrate and the silicon chips. They also suffer from high dissipation loss factors. Materials for high performance electronic applications are preferably those in which the dielectric constant approaches that of air (1.0), so that capacitive effects will be minimized, impedances will match, and signal transmissions will not be delayed.

Ceramics are used as substrates for integrated circuits, and they can form the housings for integrated circuit assemblies. For hermetic sealing of integrated circuit assemblies, ceramics are often the only suitable materials because they can withstand higher temperatures and humidities than can polymeric materials. Ceramics are desirable for their high temperature stability, adjustable thermal expansion coefficients, and controllable thermal conductivities.

The use of ceramics in electronic packaging applications is well-known. See, for example, L. M. Levinson, "Electronic Ceramics", p. 1-44, Marcel Dekker, Inc., N.Y. and R. R. Tummala, "Ceramics in Microelectronic Packaging", Am. Ceramic Soc. Bull., 67 (4) 752-58, 1988. Addition of glass to alumina to form glass-ceramic substrates having a dielectric constant of approximately 5.6, which substrates are capable of being sintered with copper or gold, is known. See, for example, Y. Shimade, et al., "Low Firing Temperature Multi Layer Glass-Ceramic Substrate", IEEE Trans. Compon. Hybrids Manuf. Technol., 6 (4) 382-86, 1983.

EP 234896 discloses low dielectric constant material for use as a thick film in very large scale integrated (VLSI) devices. The material comprises a thick film insulation matrix, a thick film organic vehicle, and hollow silica glass microspheres for use in the formation of thick film circuits. The low dielectric material is screen printed, dried, and fired. Dielectric constants ranging from 3.5 to 4.5 can be obtained.

A composite material having a dielectric constant of 4.0 has been reported by Y. Iwata, et al., in "Development of Ceramic Composite Porous Ceramic and Resin Composite with Copper Foil", pp. 65-70, in International Microelectronic Conferences, ISHM, Reston, Va., 1986. This was achieved by the use of cordierite, which has a dielectric constant varying from about 4.5 to about 6.0, impregnated with a low dielectric constant epoxy.

The primary use of ceramic packages are in high performance applications wherein a large number of circuits must be wired on individual ceramic substrates and hermetically sealed. The high performance requirement is that signal delay be at a minimum. The speed of the signals through the substrate is determined by the distance a pulse must travel and by the dielectric constant of the medium through which it travels, and is expressed in the following equation:

$$T_d = \frac{L\sqrt{K}}{C} \quad \frac{nsec}{in}$$

wherein $T_d$ represents the time delay in nanoseconds, L represents the distance a signal must travel in inches, K represents the relative dielectric constant of the ceramic, and C represents the speed of light in inches per second. A minimal time delay can be obtained by the use of ceramic material of lower dielectric constant, which can be made of materials having low electronic, dipole, and ionic polarizabilities, low molecular weight (as the dielectric constant at very high frequencies is proportional to the atomic number), low bond strength, and low density.

To improve the performance of electronic packages, the trend is to reduce their size, thereby increasing the speed of the electronic signals they carry. These characteristics can be achieved by an increase in density of silicon chips in integrated circuits (IC). However, this increase in packaging density results in generation of additional heat. Accordingly, substrates and housings for electronic packaging must be able to withstand, and preferably to dissipate, this heat.

Glass bubble-organic matrix composites are generally undesirable for high performance electronic packaging applications because they cannot withstand the high temperatures required in firing the metallized circuit layer. Also, they have high thermal expansion coefficients (e.g., in excess of $10 \times 10^{-6}/°C$.). Ceramic composites containing silica glass bubbles deform at temperatures above 800° C., because of large volume expansion due to silica phase transformation. See, for example, Verweij, et al., "Hollow Glass Microsphere Composites: Preparation and Properties", J. Matl. Science, 20, 1985, pp. 1069-78. In addition to degradation, hollow glass microspheres, especially soda lime glass compositions, produce high dielectric loss factors, which are undesirable as electronic substrates in IC packages.

It would be desirable to develop a ceramic that can be fired at the high temperature required for metallization and that would also have a dielectric constant of no greater than 5.0, in order to maintain the propagation velocity of high-speed digital signals in circuits It would also be desirable to develop a ceramic having thermal expansion coefficient matching that of silicon chips. It would also be desirable to develop a machinable ceramic which would offer transparency to microwaves and radiowaves.

SUMMARY OF THE INVENTION

This invention provides a machinable ceramic composite comprising hollow, thin-walled, refractory, ceramic bubbles uniformly distributed in a refractory, ceramic matrix. The ceramic bubbles are made of a material having a dielectric constant of less than 9. This composite has a low dielectric constant (i.e., permittivity, the multi-component form of the dielectric constant), a low dissipation factor (i.e., dielectric loss tangent), and a thermal coefficient of expansion that can be matched to that of integrated circuit (IC) chips. This composite also has relatively high mechanical strength, good machinability, low density, high temperature resistance, and high thermal shock resistance. It is capable of being processed and used at high temperatures without degradation. Some embodiments of the composite are also transparent to electromagnetic radiation in the microwave and radio wave region.

The ceramic composite material of this invention is useful as an electronic substrate for high performance electronic packaging, as a transparent window for microwaves or millimeter waves, and as a light-weight, easily machinable high temperature refractory.

The materials of this invention can be readily processed into useful shapes for a variety of applications. The presence of the ceramic bubbles allows the composite to be shaped easily and allows the fired ceramic to be machined without fracture. The dielectric constant of the composites can be controlled by appropriate selection of matrix materials and bubble materials. The dielectric constant of the composites can be further controlled by appropriate selection of bubbles of appropriate size and selection of appropriate volume concentration of bubbles in the composite.

The ceramic composites of this invention are porous, but the porosity is characterized by pores that are not interconnected. The bubbles provide sealed air pockets, and the ceramic composite has a closed cell structure, because the ceramic of the matrix completely envelopes the ceramic bubbles. There are no open pores at the surface of the composite; accordingly, little moisture or other contaminant can enter the composite.

The invention also involves a method for manufacturing the ceramic composites previously described by mixing ceramic powders, preferably selected from alumina, aluminum phosphate, mullite, cordierite, forsterite, and steatite, with ceramic bubbles, preferably selected from aluminum borosilicate and mullite. The bubbles comprise from about 10 to about 90 percent by volume of the mixture, preferably from about 40 to 70 percent by volume of the mixture, and most preferably from about 50 to 60 percent by volume of the mixture. The mixture is then formed into a desired shape by dry pressing, tape casting, or slip casting and is finally sintered at an elevated temperature of from about 1400° C. to 1700° C.

DETAILED DESCRIPTION OF THE INVENTION

As used in this application:

"ceramic" means an inorganic nonmetallic material, such as metal oxides and nonmetal oxides, consolidated by the action of heat;

"high temperature ceramic" means a ceramic material that maintains its mechanical strength and structural integrity and other properties when fired or held at 1000° C. and above;

"machinable ceramic" means a ceramic that can be drilled, sawed, nailed, screwed, assembled, or finished without causing fracture;

"fully dense" means essentially free of pores or voids;

"amorphous" means that property of a material having a diffuse X-ray diffraction pattern without definite lines to indicate the presence of a crystalline component;

"green" means unfired (a green ceramic contains ceramic materials or the precursors thereof that have not been subjected to heat treatment);

"microstructure" means the structure and size of the primary crystallites that make up a ceramic body;

"refractory" means that property of a ceramic that allows it to maintain its integrity or usefulness at temperatures in the range of 800° to 2000° C.;

"sol" means a colloidal dispersion of a finely divided solid phase in a liquid medium;

"glass" means an amorphous inorganic material that will soften or lose structural integrity at high firing temperatures (above 1000° C.);

"dielectric loss tangent" or "dissipation factor" means the ratio between the recoverable (stored) and irrecoverable (lost as heat) energy in a material when an electrical field has been applied to it;

"permittivity" means the complex dielectric constant, represented by epsilon ($\epsilon$), where $\epsilon = \epsilon' + i\epsilon''$, $\epsilon'$ represents the real portion of the dielectric function and is associated with the stored energy component and where $\epsilon''$ represents the imaginary portion of the dielectric function and is associated with the heat loss component or absorption of electromagnetic radiation; and "high performance properties" means those physical, thermal and electronic properties, such as mechanical strength, thermal expansion coefficient, machinability, dielectric constant, thermal and electrical conductivities, transparency to electromagnetic radiation, and retention of such properties after exposure to high temperatures, that are desirable for electronic materials to have.

The composite of this invention comprises hollow, thin-walled, refractory, ceramic bubbles uniformly distributed throughout a refractory, ceramic matrix. The bubbles have a dielectric constant of less than 9.

The ceramic bubbles are preferably made of aluminum borosilicate, mullite, or mixtures of the foregoing. Aluminum borosilicate bubbles are composed of alumina, boria, and silica. The ranges of ingredients of aluminum borosilicate are described in greater detail in U.S. Pat. No. 3,795,524, incorporated herein by reference. These bubbles exhibit different phases depending upon the firing temperatures; for example, there is an amorphous phase when the bubbles are fired at temperatures of 600° C. to 800° C., and a mullite phase when the bubbles are fired above 1400° C. The diameters of the bubbles can range from about 1 to about 50 micrometers. The bubbles can have wall thicknesses ranging from about 0.05 to about 0.5 micrometers.

Bubbles suitable for the practice of this invention are described in U.S. Pat. No. 4,349,456 and in co-pending application U.S. Ser. No. 07/272,526, filed Nov. 14, 1988, incorporated herein by reference. Bubbles prepared by the so-called sol-gel processes are characterized by being transparent to light and possessing fine microstructures, i.e., very fine crystallites (less than one micrometer) after firing. Ceramic bubbles can be produced by the equilibrium boiling point method described in U.S. patent application Ser. No. 07/272,526, incorporated herein by reference. Alternatively, bubbles prepared by the methods described in U.S. Pat. No. 4,349,456 can be used.

As is common in the art of ceramic processing, in order to form a shaped ceramic article of a given size, it is first necessary to form a shaped green article of larger size, which is then fired. Firing results in loss of volatiles (typically organic molecules), conversion of precursors to ceramics, and sintering. All of these changes contribute to shrinkage of the article. The amount of shrinkage that occurs during firing is a function of the composition of the green article and the temperature at which it is fired. It is important that the amount of shrinkage of a green article for a given firing temperature be known so that green article of proper size is prepared.

In the preparation of the ceramic bubble-ceramic matrix composite of the present invention, it is important that a proper choice of materials be made so that the integrity of the ceramic composite is not destroyed during firing. It is particularly important that the shrinkage of the matrix material and the shrinkage of the bubble material experienced during the firing process not greatly differ from each other. Therefore, it is frequently advantageous to incorporate green bubbles, i.e., unfired bubbles, or bubbles fired below the sintering temperature of the composite into the green composite. This reduces the mismatch between the shrinkage of the bubble and the matrix during firing of the composite, thereby producing a stronger ceramic composite.

Thus, the decision whether to incorporate green bubbles or bubbles fired to a higher temperature for a time to burn off volatiles will depend upon the composition of the matrix material. Whether the bubbles should be incorporated in their green state or fired first is a matter of choice and can be determined by one of ordinary skill in the art.

When ceramic bubbles of aluminum borosilicate fired at about 600° C. are mixed with ceramic matrix materials such as alumina, aluminum phosphate, mullite, cordierite, fosterite, or steatite and fired at high temperatures (e.g., 1400° to 1700° C.), the boria migrates from the bubbles and reacts with or forms a solid solution with the surrounding ceramic matrix. Accordingly, the composition of the bubbles changes during firing at temperatures above 1400° C. and becomes mullite ($3Al_2O_3.2SiO_2$), rather than the initial composition of aluminum borosilicate. The bubbles are also transformed from an amorphous to a crystalline state. It is believed that the migration of the boria from the bubbles promotes strong bonding of the bubbles with the surrounding matrix. Firing the composite of aluminum borosilicate bubbles and ceramic matrix appears to promote grain growth in the walls of the bubbles, thereby yielding individual mullite crystallites, which can grow to a length of over 5 micrometers. The crystallites form a network structure with voids in the walls of the bubbles. The size of these voids is about 0.5 micrometer, which is nearly the same size as that of the wall thickness of the ceramic bubble.

For electronic packaging applications such as those described herein, it is necessary for the substrate material to have those electrical and mechanical properties to allow their use in a given application. While the addition of ceramic bubbles to a matrix to form a composite reduces the dielectric constant and the dielectric loss factor, and improves the machinability over that of the unaltered ceramic matrix material, it also decreases the thermal conductivity and reduces the mechanical strength. These deficiencies can be minimized by selection of an appropriate matrix material. For example, mechanical strength can be enhanced by thermal expansion mismatch between the matrix material and the bubble material. Alumina is a good choice for the matrix of these composites because of its high mechanical strength and good thermal conductivity. Two other oxide systems, mullite ($3Al_2O_3.2SiO_2$) and cordierite ($2MgO.2Al_2O_3.5SiO_2$) are also considered good matrix materials in this invention because of their inherently low dielectric constants (6.2 and 6.0, respectively) and inherently low thermal expansion coefficients. Steatite ($MgO.SiO_2$) and forsterite ($MgO.2SiO_2$) are also considered good candidates for the matrix material.

The compositions of the ceramic composites of this invention, after firing, are (1) alumina matrix and mullite bubbles, (2) tridymite or cristobalite forms of aluminum phosphate matrix and mullite bubbles, (3) mullite matrix and mullite bubbles, (4) cordierite matrix and mullite bubbles, (5) forsterite matrix and mullite bubbles, and (6) steatite matrix and mullite bubbles. In any given composition, the micro-size air pockets are provided by ceramic bubbles. The bubbles are preferably added in a sufficient quantity to produce lower dielectric constants and thermal expansion coefficients close to those of IC chips (Si or Ga-As). Sintering temperatures of alumina matrix-mullite bubble composites, aluminum phosphate matrix-mullite bubble composites, and mullite matrix-mullite bubble composites are generally in the range of 1600° C. to 1700° C. Sintering temperatures of cordierite matrix and mullite bubble composites are generally in the range of 1400° C. to 1430° C.

Homogeneity of the composite is important in order to obtain consistent and reproducible dielectric constants and dielectric loss tangents throughout certain temperature and frequency ranges. Homogeneity of the composite can be obtained by using micro-sized ceramic bubbles having a narrow size distribution. The composite must have many bubbles per cubic wavelength for the material to behave as a homogeneous material. That is, the diameter of a single bubble must be much smaller than the wavelength of incident radiation. If the diameter of the bubbles is an appreciable fraction of the incident wavelength, the bubbles will act as individual scatterers and invalidate the concept of permittivity or dielectric constant as previously described. Therefore, for high frequencies (at 100 GHz, the wavelength is 3000 micrometers), the bubbles must be small, i.e., on the order of tens of micrometers.

Physical, electrical, mechanical, and thermal properties of these composite materials can be tailored to desired values by varying the composition of the ceramic bubble and of the matrix.

The ceramic composites of the present invention demonstrate good machinability and resistance to high temperature along with the characteristics of low dielectric constant, low dielectric loss, good mechanical strength, excellent resistance to thermal shock, and thermal expansion matched to integrated circuit chips. Good machinability, as used herein, means that conventional metal working tools, such as tungsten carbide drill bits, diamond saws, and grinders, can be used to shape or form a piece. Doughnut-shaped pieces of the ceramic composite can be formed by drilling a small hole in the center of a disc shaped by a carbide grinder. Thermal expansion matching is necessary in ceramic materials that are required for use in high-density, high-signal-speed packaging. Embodiments of this invention can also be employed with devices that need transparent windows to microwaves or millimeter waves, or to materials that need microwave transparency in addition to acceptable power transmission efficiencies due to the low dielectric constants and low loss tangent values.

Turning now to the method of this invention, the method comprises the steps of (1) forming a ceramic matrix; (2) mixing the matrix of step (1) with ceramic bubbles; (3) drying the mixture; (4) shaping the mixture; and (5) firing the mixture to form the composite material. The matrix portion of the composite can be prepared from a slurry according to the following procedure:

(1) the components of the matrix material, in powdered form, are dispersed in a mixture containing water or organic solvent, and plasticizer;

(2) the mixture from step (1) is ball-milled, normally for a period ranging from 16 to 24 hours; and (3) a binder is added to the mixture from step (2) and the resulting mixture is ball-milled again, normally for a period ranging from one to two hours.

Plasticizers useful for the foregoing procedure include glycerol, butyl benzyl phthalate ("Santicizer 160", Monsanto Company), polyethylene glycol (MPEG 2000, Union Carbide Company), dioctyl phthalate (Aldrich Chemical Co., Inc.), and polyalkylene glycol (Olin Corporation).

Dispersant is added periodically during the initial phase of the milling process to promote uniform distribution of the powdered components and to prevent them from agglomerating. A useful dispersant for water-based systems is an ammonium salt of a polyelectrolyte ("Daxad 32", W. R. Grace & Co.) and a useful dispersant for solvent-based systems is corn oil.

The purpose of the binder is to provide high strength to the unfired substrate. The binder also promotes good handling and storage characteristics and tends to suppress the formation of cracks, pinholes, and defects in the unfired or fired substrates. For example, in water-based systems, a useful binder material is acrylic polymer emulsion ("Rhoplex AC33", Rohm and Haas Co.); for solvent-based systems, a useful binder is polyvinyl butyral ("Butvar B-76", Monsanto Company).

Ball-milling can be carried out in a porcelain ball-mill using alumina balls as grinding media.

Powders can be generated by drying the slurries in trays at room temperature, granulating the dried material, and then sieving the granules through U.S. standard sieves No. 100 to No. 35 to provide a 150 micrometer to 500 micrometer cut.

Ceramic bubbles can be mixed either with the ceramic matrix slurry or with a powder prepared from the slurry. Bubbles made of mullite or aluminum borosilicate can be used. The ceramic bubbles can be unfired, green bubbles, or they can be fired at temperatures below 1500° C. for durations ranging from several minutes to three hours before incorporation thereof into the mixture. Generally, the bubbles are fired at temperatures ranging from 600° C. to 1200° C. for up to one hour to burn off volatile organics before being mixed with the powdered matrix material. Firing aluminoborosilicate bubbles by themselves at 1400° C. results in the formation of a mullite crystal phase due to volatilization of most of the boria.

To prepare a sample for dry pressing, the desired ceramic matrix powder is mixed with ceramic bubbles having diameters ranging from 1 to 50 micrometers, preferably by means of a roll mill. The ratio of bubbles to powder typically ranges from about 0.6:1.0 to about 1.5:1.0, based on volume. The mixture is normally rolled in a container before being mixed with a small amount of binder, which aids in dry pressing the composite. The mixture is dried at room temperature, granulated, and then sieved to provide a 150 micrometer to 500 micrometer cut. For dry pressing of ceramic composites in this invention, pellets, typically having a diameter of 2.2 inches, are molded in a hydraulic press (e.g., a Carver Laboratory Press). The pressure applied to the powders in the mold for dry pressing is typically about 35 MPa. Such a pressure is sufficient to form dry pressed pellets having a thickness of approximately one millimeter. The pellets can then be placed in a furnace and fired according to an appropriate firing schedule, some of which will be described in the examples. The pellets are then removed from the furnace when the furnace has cooled. Dry pressed pellets can be used in measurement of physical properties of the composite material.

To prepare a sample for tape casting or for slip casting, ceramic bubbles are mixed with the ceramic matrix slurry. The ratio of ceramic matrix powder to bubbles preferably ranges from about 0.6:1 to 1.5:1, based on volume. Bubbles and ceramic matrix powder can be mixed in any ratio desired, but below a ratio of 0.6:1, the dielectric properties are generally unsatisfactory, and above a ratio of 1.5:1, the mechanical strength is generally unsatisfactory. The slurry of bubbles and matrix powder thickens as the volatile solvents evaporate during mixing; when the viscosity has reached 2500 to 2900 cP, the slurry can be tape cast or slip cast.

For slip casting, the slurry is normally poured into a porous plaster mold of the desired shape. A vacuum is applied to assist in removing air bubbles from the slip, because air bubbles could later contribute to the formation of voids in the composite. The sample is typically dried in air for about 24 hours, removed from the mold, and fired according to an appropriate schedule, such as those described in the examples. The sample can then be removed from the furnace after it has cooled to room temperature.

For tape cast samples, tape is produced by uniformly spreading the slurry onto a support, such as polyester film, typically by a doctor blade. It is sometimes convenient to treat polyester film with a release agent, such as silicone spray, before casting out the slurry. The resulting green ceramic tape cast samples are typically approximately one millimeter thick. After drying in air, the sample is removed from the casting surface. It is at this point that the tape is customarily metallized, typically by screen printing processes, for use in electronic circuit applications. After firing, and after the furnace reaches room temperature, the sample is removed from the furnace.

The strength and stability of the ceramic green sheet is important. Satisfactory composites can be achieved by the proper selection of components for the binder, which components are added when the ceramic matrix slurry is prepared, and by controlled casting processes, which are known to one of ordinary skill in the art. The purpose of the binder is to bond the ceramic particles and bubbles temporarily during formation of the green sheet.

In order to produce samples of tape that can be used in electronic applications, the green sheets are screen-printed with an appropriate conductive paste of metal powders, such as molybdenum or tungsten powder. The green sheet can be cut, e.g., by a knife or a punch cutter, into appropriate sizes before screen printing. The metal pastes should not react with the binder of the green sheet. After the metal pastes are printed on the green sheets, the printed sheets are dried in an oven, typically at approximately 60° C. for approximately five hours. Co-firing or sintering is normally performed in a reducing atmosphere, such as dry hydrogen, in order to prevent oxidation of the metals at the firing temperatures of 1400° C. to 1700° C. The result is a useful article comprising a fired ceramic and a layer of metal printed in a pattern suitable for use in electronic circuits.

In the examples that follow, the coefficient of thermal expansion was measured by means of a Perkin-Elmer 7 series thermal analysis system from room temperature to 400° C. at a rate of 5° C./min. Pelletized samples were used for this measurement. The pellets were cylindrical having the dimensions of 0.635 cm in diameter and 0.64 cm in height.

The flexural strength (3 point modulus of rupture) was measured according to ASTM procedure ASTM-D790 (1986), "Modulus of Rupture test for electric/electronic device." The aforementioned pelletized samples were used for this measurement.

The complex permittivity and permeability at high frequency were measured in a 7 mm coaxial line. The complex permittivity describes the bulk electrical properties of a homogeneous material. The common term "dielectric constant" refers to the real part of the complex permittivity. A dielectric constant is not actually constant, however, because it depends on the frequency of the electromagnetic field used in its measurement.

Complex permeability is similar to the complex permittivity. It describes the magnetic properties of a material as the complex permittivity describes the electrical properties. A measurement of complex permeability of 1.0 means that there is no magnetic response in the sample.

Because low dielectric materials have many different functions, they are used at different frequencies. The complex permittivity was measured at 0.1 to 20 GHz because these are typical frequencies of radar and microwave propagation. Low values of the complex permittivity (approximately 2.0) are needed in order to have non-absorbing transparent materials at these frequencies. Complex permittivity of other samples was measured at 1 MHz for some of the examples because 1 MHz is a typical frequency in computer industry usage.

Values of complex permittivity and permeability were calculated from measurements of complex transmission and reflection coefficients. These were measured by means of an HP8510 network analyzer from 0.1 to 20.1 GHz. Dielectric constants and dissipation factors at 1 MHz were measured by means of an HP 4192A analyzer.

EXAMPLE 1

A dry-pressed pellet was prepared in order to measure the dielectric characteristics of an alumina matrix-aluminum borosilicate bubble composite.

An alumina powder was prepared in the following manner:

(1) Alumina (alpha-$Al_2O_3$) (200 g) and magnesium oxide (0.5 g) were dispersed in a mixture containing water (140 g), hydrogen chloride (12 g), and glycerol (35.6 g), and the dispersion was ball-milled for 12 hours;

(2) An aqueous solution of poly(vinyl alcohol) (3% dry solids, 200 g) was added to the dispersion, and the resulting dispersion was ball-milled for one hour; and (3) A powder was prepared by drying the slurry in trays at room temperature, granulating, and sieving to provide a 297 micrometer cut.

A composite was prepared by mixing aluminum borosilicate ceramic bubbles ($3Al_2O_3.B_2O_3.2SiO_2$, fired at 950° C., 1 to 50 micrometer diameter, 0.05 to 0.5 micrometer wall thickness) with the aforedescribed alumina powder in a roll mill (50% bubbles by volume). For dry pressing of ceramic composites, pellets having diameters of 1.25 and 2.2 inches were molded in a hydraulic press from mixtures of the aluminum borosilicate ceramic bubbles and alumina powder. The pressure applied to the powders in the mold for dry pressing was 35 MPa. The thickness of the resulting dry pressed pellets was one millimeter.

The pellets were fired according to the following schedule:

| | |
|---|---|
| From room temperature to 1000° C. | 50° C./hour |
| From 1000° C. to 1600° C. | 100° C./hour |
| Held at 1600° C. | 0.5 hour |

The fired pellets were then allowed to cool in the furnace to room temperature. The pellets were white and had smooth surfaces. A fired pellet of this composite was cut using a high speed diamond saw. No cracking or chipping of the composite was observed. Examination of a cross-section of a pellet indicated that the bubbles were uniformly distributed.

Alpha-alumina (major phase) and mullite (minor phase) were identified by X-ray diffraction analysis. The sample had a dielectric constant of approximately 2.4 and complex permittivity of less than or equal to 0.03, yielding a loss tangent of 0.0125, measured from 0.1 to 20 GHz. The material had no magnetic response.

EXAMPLE 2

A 1 mm×5.08 cm disc or pellet was prepared in order to measure the dielectric properties and flexural strength of an aluminum phosphate matrix-aluminum borosilicate bubble composite.

A composite containing aluminum phosphate powder and ceramic bubbles was prepared in the following manner. An aluminum phosphate slurry was prepared by mixing together aluminum phosphate (80 g), a dispersant (ammonium salt of a polyelectrolyte, "Daxad 32")(0.3 g), a plasticizer (butyl benzyl phthalate, "Santicizer 160") (2.0 g), a binder (acrylic polymer emulsion, "Rhoplex AC33")(11 g), and water (60 g). This slurry was mixed with aluminum borosilicate bubbles of the type described in Example 1, at a volume ratio of 1:1. The resulting mixture was cast onto a polypropylene container mold and placed in a vacuum to remove substantially all of the air bubbles. The composite was dried in air and removed from the mold.

The pellets were fired according to the following schedule:

| From room temperature to 1000° C. | 50° C./hour |
|---|---|
| From 1000° C. to 1600° C. | 100° C./hour |
| Held at 1600° C. | 1 hour |

The fired pellets were then allowed to cool in the furnace to room temperature. The pellets were white and had smooth surfaces. Examination of a cross-section of the pellet indicated no broken bubbles and that the bubbles were uniformly distributed. X-ray diffraction analysis showed that tridymite and cristobalite forms of aluminum phosphate were the major phases, and mullite was a minor phase. The sample had a dielectric constant of approximately 2.1 and a complex permittivity of of less than or equal to 0.02, yielding a loss tangent of 0.0095, in the frequency range of 0.1 to 20 GHz. The material had no magnetic response.

The flexural strength (3 point modulus of rupture) of a pellet having a bubble loading of approximately 60 volume percent was 35 MPa (measured according to ASTM D790-86).

EXAMPLE 3

A pellet was prepared in order to measure the dielectric properties and flexural strength of a cordierite matrix-aluminum borosilicate bubble composite.

A composite was prepared by mixing cordierite powder and aluminum borosilicate ceramic bubbles (fired at 600° C., 1 to 50 micrometer diameter, 0.05 to 0.5 micrometer wall thickness). The cordierite powder was prepared from a cordierite slurry, in the following manner:

(1) Cordierite powder (280 g) prepared from magnesium oxide (38.6 g), alumina (97.6 g), silica (143.8 g), and calcium oxide (1.4 g) was mixed with toluene (500 g) and corn oil (4.8 g) and ball-milled for 16 hours;

(2) Polyvinyl butyral ("Butvar B76")(8.4 g) was added to the mixture, and the resulting mixture was ball-milled for two hours; and (3) The slurry was dried at room temperature and the resultant dried cake was crushed with a mortar and pestle. The dried, crushed powder was passed through a 90 micrometer sieve prior to further use.

The sieved dried cordierite powder (69.2 g) was mixed with aluminum borosilicate ceramic bubbles (20 g) and an aqueous solution of ethylene glycol (60% solids, "Carbowax", Union Carbide Corporation, 4000 cP)(30 g). This mixture was then dried, granulated, and sieved to provide a 500 micrometer cut. Pellets (5.08 cm diameter) were molded in a hydraulic press from this mixture.

The pressure applied to the mixture in the mold during dry pressing was 35 MPa. The thickness of the dry pressed pellets was one millimeter. These pellets were fired according to the following schedule:

| From room temperature to 1000° C. | 50° C./hour |
|---|---|
| From 1000° C. to 1410° C. | 100° C./hour |
| Held at 1410° C. | 2 hours |

An alumina plate (10 cm diameter, 0.42 cm thickness) was loaded onto individual pellets during firing to prevent warpage. The fired pellets were then allowed to cool in the furnace to room temperature. The pellets prepared in this manner were white and had smooth surfaces. Examination of a cross-section of a pellet indicated no broken bubbles and that the bubbles were uniformly distributed. X-ray diffraction analysis of the pellets detected cordierite (the major phase) and mullite (the minor phase). The pellets had a dielectric constant of 3.3 and dissipation factor of 0.001 at 1 MHz.

The coefficient of thermal expansion was $1.5 \times 10^{-6}/°C$. from room temperature (25° C.) to 400° C. The flexural strength (3 point modulus of rupture) of the composite was 56 MPa. The void volume of the fired composite was determined by microscopy to be 40%.

EXAMPLE 4

In order to measure the physical and electronic properties of a mullite matrix-aluminum borosilicate bubble composite, a pellet was prepared by mixing mullite powders and aluminum borosilicate ceramic bubbles (fired at 600° C.). A mullite powder was prepared from a mullite slurry in the following manner:

(1) Mullite powder (200 g), consisting of alumina (144 g) and silica (56 g), was dispersed in a mixture of water (300 g) and a dispersant ("Daxad 32") (2 g);

(2) The resulting mixture was ball-milled for 16 hours;

(3) An acrylic polymer emulsion ("Rhoplex AC33")(16 g) was added to the mixture from the preceding step, and the resulting mixture was ball-milled for two hours; and (4) The slurry was dried in an oven set at 80° C., and the dried powders were passed through a 90 micrometer sieve.

The sieved dried mullite powder (20.6 g) from step (4) was mixed with aluminum borosilicate ceramic bubbles (1 to 50 micrometer diameter, 0.05 to 0.5 micrometer wall thickness)(5 g) and an aqueous solution of ethylene glycol (60% solids, "Carbowax", Union Carbide Corporation, 4000 cP)(8.6 g). This mixture was then dried, granulated, and sieved to provide a 500 micrometer cut. Pellets (5.59 cm diameter) were molded in a hydraulic press from this mixture. The pressure applied to the powders in the mold for dry pressing was 35 MPa. The thickness of the resulting dry pressed pellets was one millimeter.

The pellets were fired according to the following schedule:

| From room temperature to 1000° C. | 50° C./hour |
|---|---|
| From 1000° C. to 1700° C. | 100° C./hour |
| Held at 1700° C. | 1 hour |

The fired pellets were then allowed to cool in the furnace to room temperature. The pellets were white and had a smooth surface. The pellets were free from cracks or voids. The bubbles were uniformly distributed in the pellets.

X-ray diffraction analysis showed that a mullite phase was detected for these samples. The dielectric constant was 3.2 and the dissipation factor was 0.008, at 1 MHz. The coefficient of thermal expansion of the sample was $4.0 \times 10^{-6}/°C$. from room temperature (25° C.) to 400° C., which matches that of silicon chips mounted on ceramic substrates in micro-electronic packaging.

EXAMPLE 5

This example demonstrates tape casting of a cordierite matrix-aluminum borosilicate bubble composite. A cordierite powder was prepared from a cordierite slurry in the following manner:

(1) Cordierite powder (280 g), comprising magnesium oxide (38.6 g), alumina (97.6 g), and silica (143.8 g), was dispersed in a mixture of toluene (500 g), corn oil (9.5 g), and a polyalkylene glycol (triethylene glycol hexoate, Olin Corporation)(40 g);

(2) The resulting mixture was ball-milled for 20 hours; and (3) Polyvinyl butyral ("Butvar B-76")(35 g) was added to the mixture and the resulting mixture was ball-milled for two hours.

The volume of the slurry after ball-milling was 1170 cc. A sample of the cordierite slurry (106 cc) was taken from the ball-milled slurry and mixed with aluminum borosilicate bubbles (fired at 600° C., 10 to 50 micrometer diameter)(3.8 g) by means of an air-propelled stirrer. The slurry mixture thickened as toluene evaporated during mixing; when the viscosity had increased to 2000 cP, the mixture was cast on a polyester substrate and uniformly spread by a doctor blade. The polyester substrate had been sprayed with silicone to act as a release agent. The sample was allowed to dry at room temperature for 10 hours before it was stripped from the casting surface. The dried tape sample (3.8 cm×3.8 cm) was fired according to the following schedule:

| From room temperature to 1000° C. | 50° C./hour |
| From 1000° C. to 1410° C. | 100° C./hour |
| Held at 1410° C. | 2 hours |

An alumina plate (10 cm diameter, 0.42 cm thick) was loaded onto individual samples during firing to prevent warpage. The tape sample was removed from the furnace when the temperature inside the furnace reached room temperature.

The tape sample was white and had a smooth surface. It was free of cracks and voids. Bubbles were uniformly distributed in the tape sample.

The dielectric constant was 4.4 and the dissipation factor was 0.001 measured at 1 MHz.

EXAMPLE 6

Composites were prepared by mixing cordierite powders and aluminum borosilicate ceramic bubbles (fired at 600° C.). A slurry was prepared in the following manner:

(1) Cordierite powder (280 g), consisting of magnesium oxide (38.6 g), alumina (97.6 g), and silica, (143.8 g) was dispersed in a mixture of toluene (500 g), corn oil (5 g), a polyalkylene glycol (triethylene glycol hexoate, Olin Corporation)(10.7 g), and dioctyl phthalate (8.7 g);

(2) The mixture was ball-milled for 16 hours; and (3) Polyvinyl butyral ("Butvar B76")(17 g) was added to the foregoing mixture, and the resulting mixture was ball-milled for two hours.

The volume of the slurry after ball-milling was 1008 cc. A sample of the cordierite slurry (118 g) was mixed with aluminum borosilicate bubbles (1 to 50 micrometer diameter, 0.05 to 0.5 micrometer wall thickness)(6.08 g), corn oil (5 g), triethylene glycol hexoate (10.7 g), dioctyl phthalate (8.7 g), polyvinyl butyral (17 g), and an amount of toluene sufficient to yield a mixture containing 50% by weight solids. This mixture was stirred thoroughly by means of an air-propelled stirrer for 30 minutes before toluene was evaporated by blowing air across the mixture. After the viscosity was adjusted to 2000 cP, the mixture was cast on a polyester substrate and uniformly spread by a doctor blade. The polyester substrate had been sprayed with silicone to act as a release agent. The sample was allowed to dry at room temperature for 10 hours before it was stripped from the casting surface. The dried tape sample (3.8 cm×3.8 cm) was fired according to the following schedule:

| From room temperature to 1000° C. | 50° C./hour |
| From 1000° C. to 1410° C. | 100° C./hour |
| Held at 1410° C. | 2 hours |

The tape sample was removed from the furnace when the temperature inside the furnace reached room temperature. The fired sample was white, had a smooth surface, and was free of cracks or voids.

EXAMPLE 7

A composite comprising aluminum borosilicate bubbles in a mullite matrix was prepared by tape casting a mixture of mullite slurry and aluminum borosilicate bubbles that were fired to 600° C. The mullite slurry was prepared in the following manner:

(1) Alumina (144 g) and silica (56 g) were dispersed in a mixture of water (266 g), dispersant ("Daxad 32")(2 g), and plasticizer ("Santicizer 160") (3.2 g);

(2) The resulting mixture was ball-milled for 16 hours; and (3) An acrylic polymer emulsion ("Rhoplex AC33")(16 g) was added to the mixture from the preceding step, and the resulting mixture was ball-milled for two hours.

The slurry, which contained 31.6 g oxide solids and had a viscosity of 2,500 cP, was mixed with aluminum borosilicate bubbles (5 g), cast under a doctor blade onto a polypropylene sheet, and then dried in open air.

The resulting green substrate had a thickness of one millimeter. The green substrate was stripped from the polypropylene film, cut into desired sizes, and fired at 1700° C. for two hours according to the following firing schedule:

| From room temperature to 1000° C. | 100° C./hour |
| From 1000° C. to 1700° C. | 300° C./hour |
| Held at 1700° C. | 2 hours |

The composite was removed from the furnace when the temperature inside the furnace reached room temperature. The resulting composite had a dielectric constant of 4.4 and dissipation factor of 0.001 at 1 MHz. The composite was white and flat, had a smooth surface, and was free of cracks or voids.

EXAMPLE 8

A series of composites comprising aluminum borosilicate bubbles in a mullite matrix were prepared by tape casting mixtures of mullite slurry and aluminum borosilicate bubbles (fired at 600° C.). To prepare pellets for dry pressing, a mullite slurry prepared as described in Example 7 was dried in trays at room temperature, granulated, and sieved through U.S. standard sieve No. 70 (210 micrometers). This dry powder was mixed with aluminum borosilicate bubbles and binder (60% solids, "Carbowax", Union Carbide Corporation, 4000 cP) and molded in a hydraulic press into rectangularly-shaped samples (34.9 mm×9.5 mm) having a thickness of two millimeters. These samples were used for the measurement of flexural strength (3 point modulus rupture). The compositions of the dry pressed mullite matrix-aluminum borosilicate bubble composite samples are shown in Table I and flexural strength measurements are shown in Table II.

TABLE I

| Sample designation | Ingredient | | |
|---|---|---|---|
| | Ceramic bubbles (% by weight) | Binder addition (% by weight) | Dry mullite powder (% by weight) |
| M1 | 4.95 | 22.28 | 72.77 |
| M2 | 6.91 | 27.62 | 65.47 |
| M3 | 9.69 | 29.07 | 61.24 |
| M4 | 12.97 | 32.43 | 54.60 |

The samples shown in Table I were fired at 1700° C. for two hours employing the same firing schedule as was used for the tape casting samples in Example 7. The samples were removed from the furnace when the furnace reached room temperature. The fired samples were cut by slow speed diamond saw and tested for 3 point bending under the following conditions:
(1) crosshead rate, 0.1 cm/min;
(2) span, 1.0 inch; and
(3) chart rate, 10 cm/min.

TABLE II

| Sample designation | Dimensions (in.) | | Force at failure (kg) | Modulus of rupture (psi) |
|---|---|---|---|---|
| | depth | width | | |
| M1 | 0.087 | 0.111 | 4.7 | 18,000 |
| M2 | 0.090 | 0.111 | 5.0 | 19,000 |
| M3 | 0.084 | 0.112 | 2.6 | 10,500 |
| M4 | 0.069 | 0.111 | 2.2 | 13,500 |

The data that samples with high volume loadings of bubbles retain sufficient strength to be useful in many applications, e.g., electronic packaging, gyrotron windows, radome applications.

The fired composites were white, flat, and had smooth surfaces and good dimensional stabilities. Examination by scanning electron microscope of a cross-section of a fired composite revealed discrete air pockets formed by the bubbles, i.e., no broken bubbles and no interconnected porosity. The ceramic bubbles were uniformly distributed throughout the matrix.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. An article comprising a fired ceramic composite which comprises hollow, thin-walled, refractory, ceramic bubbles having a dielectric constant less than 9, said bubbles uniformly distributed throughout a refractory, ceramic matrix, said composite further bearing a metallized layer thereon, said composite having been fired at a temperature of at least 1,000° C.

2. An article comprising an unfired ceramic composite which comprises hollow, thin-walled, refractory, ceramic bubbles having a dielectric constant less than 9, said bubbles uniformly distributed throughout a refractory, ceramic matrix, said composite bearing a metallized layer thereon, said composite not having been fired at a temperature of at least 1,000° C.

3. An article comprising a ceramic composite which comprises hollow, thin-walled, refractory, ceramic bubbles having a dielectric constant less than 9, said bubbles uniformly distributed throughout a refractory, ceramic matrix, said composite bearing a circuit thereon.

4. The article of claim 3, wherein said article has not been fired at a temperature of at least 1,000° C.

5. The article of claim 3, wherein said article has been fired at a temperature of at least 1,000° C.

6. An article comprising a ceramic composite which comprises hollow, thin-walled, refractory, ceramic bubbles having a dielectric constant less than 9, said bubbles uniformly distributed throughout a refractory, ceramic matrix, said composite bearing a metallized layer thereon.

* * * * *

UNITED STATES PATENT AND TRADEMARK OFFICE
CERTIFICATE OF CORRECTION

PATENT NO. : 5,213,878
DATED : May 25, 1993
INVENTOR(S) : Moh et al.

It is certified that error appears in the above-identified patent and that said Letters Patent is hereby corrected as shown below:

Item [75] Inventors: third line, "Oakdlae" should be --Oakdale--.

Col. 1, line 6, "U.S. Pat. No. 5,108,9" should be --U.S. Pat. No. 5,108,958.--.

Col. 3, line 5, There should be a period after "circuits".

Signed and Sealed this

Fourth Day of January, 1994

*Attest:*

BRUCE LEHMAN

*Attesting Officer*     Commissioner of Patents and Trademarks